United States Patent
Varghese et al.

(10) Patent No.: US 7,227,201 B2
(45) Date of Patent: Jun. 5, 2007

(54) CMOS DEVICE HAVING DIFFERENT AMOUNTS OF NITROGEN IN THE NMOS GATE DIELECTRIC LAYERS AND PMOS GATE DIELECTRIC LAYERS

(75) Inventors: Ajith Varghese, McKinney, TX (US); Husam Alshareef, Austin, TX (US); Rajesh Khamankar, Coppell, TX (US)

(73) Assignee: Texas Instruments Incorporated, Dallas, TX (US)

( * ) Notice: Subject to any disclaimer, the term of this patent is extended or adjusted under 35 U.S.C. 154(b) by 3 days.

(21) Appl. No.: 10/927,858

(22) Filed: Aug. 27, 2004

(65) Prior Publication Data

US 2006/0043369 A1    Mar. 2, 2006

(51) Int. Cl.
*H01L 27/10* (2006.01)

(52) U.S. Cl. .................. 257/204; 257/69; 257/206; 257/338; 257/350; 257/351

(58) Field of Classification Search ............. None
See application file for complete search history.

(56) References Cited

U.S. PATENT DOCUMENTS 5,763,922 A * 6/1998 Chau .................... 257/371
6,228,721 B1 * 5/2001 Yu ......................... 438/275
6,255,698 B1 * 7/2001 Gardner et al. ......... 257/369

* cited by examiner

*Primary Examiner*—Wai-Sing Louie
(74) *Attorney, Agent, or Firm*—Peter K. McLarty; W. James Brady, III; Frederick J. Telecky, Jr.

(57) ABSTRACT

The present invention provides a complementary metal oxide semiconductor (CMOS) device, a method of manufacture therefor, and an integrated circuit including the same. The CMOS device (100), in an exemplary embodiment of the present invention, includes a p-channel metal oxide semiconductor (PMOS) device (120) having a first gate dielectric layer (133) and a first gate electrode layer (138) located over a substrate (110), wherein the first gate dielectric layer (133) has an amount of nitrogen located therein. In addition to the PMOS device (120), the CMOS device further includes an n-channel metal oxide semiconductor (NMOS) device (160) having a second gate dielectric layer (173) and a second gate electrode layer (178) located over the substrate (110), wherein the second gate dielectric layer (173) has a different amount of nitrogen located therein. Accordingly, the present invention allows for the individual tuning of the threshold voltages for the PMOS device (120) and the NMOS device (160).

7 Claims, 5 Drawing Sheets

CMOS DEVICE HAVING DIFFERENT AMOUNTS OF NITROGEN IN THE NMOS GATE DIELECTRIC LAYERS AND PMOS GATE DIELECTRIC LAYERS

TECHNICAL FIELD OF THE INVENTION

The present invention is directed, in general, to integrated circuits and, more specifically, to a complementary metal oxide semiconductor (CMOS) device having different amounts of nitrogen in its n-channel metal oxide semiconductor (NMOS) device gate dielectric layers than its p-channel metal oxide semiconductor (PMOS) device gate dielectric layers, and a method of manufacture therefor.

BACKGROUND OF THE INVENTION

As the geometries of semiconductor devices, and particularly complementary metal oxide semiconductor (CMOS) devices, are scaled to continually shorter gate lengths, issues that were previously little or no concern are now significant. One such issue is the different dielectric constant values required for gate dielectrics for p-channel metal oxide semiconductor (PMOS) devices and n-channel metal oxide semiconductor (NMOS) devices. Specifically, PMOS and NMOS devices have different threshold voltage requirements, performance requirements, reliability requirements, etc.

It is currently believed that the amount of nitrogen in the gate dielectrics controls the dielectric constant of the PMOS and NMOS devices to a high degree, at least in the case of nitrided gate dielectrics. The amount of nitrogen in the PMOS and NMOS devices is, therefore, of paramount importance. Unfortunately, the industry presently uses a single plasma nitridation process to introduce an equal amount of nitrogen into the blanket layer of gate dielectric material, regardless of whether that location will ultimately be a PMOS device or an NMOS device. In these devices, the amount of nitrogen is neither tailored for the PMOS device nor the NMOS device, but chosen to accommodate both. Thus, what results are both PMOS devices and NMOS devices that operate at a level below what each might if it were not a CMOS set-up.

Accordingly, what is needed in the art is a CMOS device that does not experience the difficulties associated with the prior art devices and methods.

SUMMARY OF THE INVENTION

To address the above-discussed deficiencies of the prior art, the present invention provides a complementary metal oxide semiconductor (CMOS) device, a method of manufacture therefor, and an integrated circuit including the same. The CMOS device, in an exemplary embodiment of the present invention, includes a p-channel metal oxide semiconductor (PMOS) device having a first gate dielectric layer and a first gate electrode layer located over a substrate, wherein the first gate dielectric layer has an amount of nitrogen located therein. In addition to the PMOS device, the CMOS device further includes an n-channel metal oxide semiconductor (NMOS) device having a second gate dielectric layer and a second gate electrode layer located over the substrate, wherein the second gate dielectric layer has a different amount of nitrogen located therein.

Additionally, as previously mentioned, the present invention provides a method for manufacturing the aforementioned CMOS device. The method, among other steps, includes (1) forming a p-channel metal oxide semiconductor (PMOS) device having a first gate dielectric layer and a first gate electrode layer over a substrate, wherein the first gate dielectric layer has an amount of nitrogen located therein, and (2) forming an n-channel metal oxide semiconductor (NMOS) device having a second gate dielectric layer and a second gate electrode layer over the substrate, wherein the second gate dielectric layer has a different amount of nitrogen located therein.

Further included within the present invention is an integrated circuit including the CMOS device. In addition to that disclosed above, the integrated circuit includes an interlevel dielectric layer having interconnects located therein located over the PMOS and NMOS devices, wherein the interconnects contact the PMOS and NMOS devices to form an operational integrated circuit.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
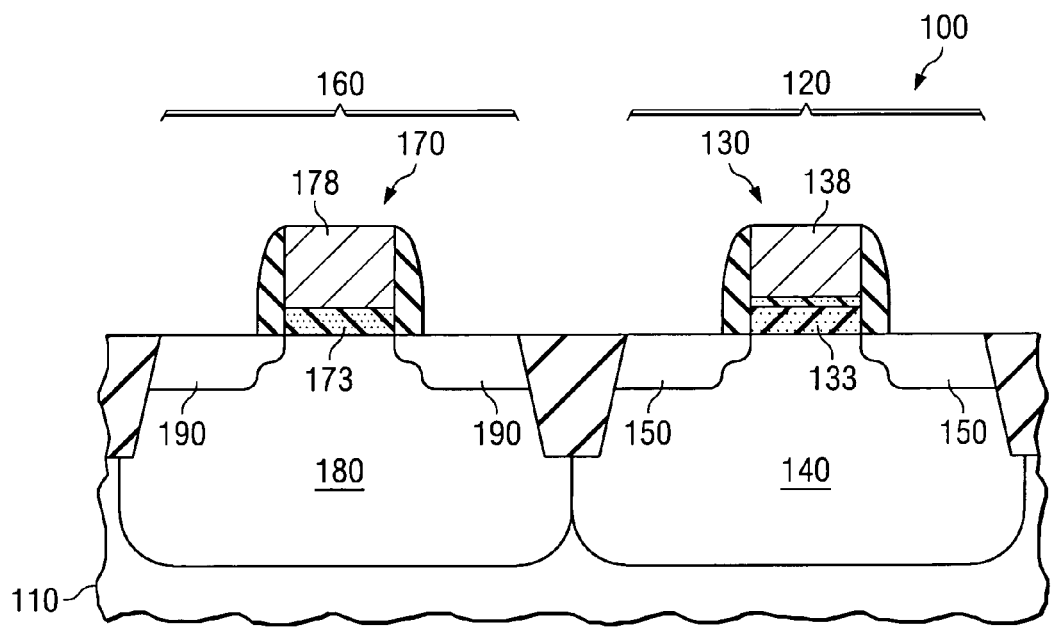
FIG. 1 illustrates a cross-sectional view of one embodiment of a complementary metal oxide semiconductor (CMOS) device constructed according to the principles of the present invention.

Referring initially to FIG. 1, illustrated is a cross-sectional view of one embodiment of a complementary metal oxide semiconductor (CMOS) device 100 constructed according to the principles of the present invention. In the embodiment illustrated in FIG. 1, the CMOS device 100 includes a substrate 110. Located over the substrate 110 is a p-channel metal oxide semiconductor (PMOS) device region 120 and an n-channel metal oxide semiconductor (NMOS) device region 160.

In an exemplary embodiment the PMOS device region 120 and the NMOS device region 160 are similar type devices, but for the dopants used therein. For example, in the illustrative embodiment of FIG. 1, the PMOS device region 120 and NMOS device region 160 both comprise non-power enhanced metal oxide semiconductor (non-PEMOS) devices, such as devices that are not used for power management. In an alternative embodiment, however, the PMOS device region 120 and NMOS device region 160 both comprise power enhanced metal oxide semiconductor (PE-MOS) devices, and therefore are used for power management. In the end, it is desired that the PMOS device region 120 and NMOS device region 160 be of the same type device.

The PMOS device region 120 illustrated in FIG. 1 includes a gate structure 130 located over the substrate 110. As is illustrated, the gate structure 130 initially includes a gate dielectric layer 133. The gate dielectric layer 133, which in the embodiment of FIG. 1 comprises a gate oxide layer, includes an amount of nitrogen therein. The gate structure 130 further includes a conventional gate electrode layer 138.

Located under the gate structure 130 in the PMOS device region 120 is an n-type well region 140. As would be expected, the N-type well region 140 is doped with a predetermined amount of an N-type dopant, such as phosphorous, arsenic or another similar dopant. Also located within the substrate 110 in the PMOS device region 120 are conventional P-type source/drain regions 150. The P-type source/drain regions 150, opposite to the N-type well region 140, are doped with a P-type dopant such as boron.

The NMOS device region 160 illustrated in FIG. 1, on the other hand, includes a gate structure 170 located over the substrate 110. As is illustrated, the gate structure 170 also includes a gate dielectric layer 173. The gate dielectric layer 173, which in the embodiment of FIG. 1 also comprises a gate oxide layer, includes nitrogen therein.

Unique to the present invention, however, the gate dielectric layer 173 includes a different amount of nitrogen located therein than the gate dielectric layer 133 of the PMOS device region 120. In an exemplary embodiment, the gate dielectric layer 173 includes a smaller amount of nitrogen therein than the gate dielectric layer 133. As would be appreciated, in one advantageous embodiment of the present invention a nitrogen concentration of the gate dielectric layer 133 ranges from about 3E15 atoms/cm$^3$ to about 1E16 atoms/cm$^3$ and a nitrogen concentration of the gate dielectric layer 173 ranges from about 1E14 atoms/cm$^3$ to about 4E15 atoms/cm$^3$. The gate structure 170 further includes a conventional gate electrode layer 178.

Located under the gate structure 170 in the NMOS device region 160 is a P-type well region 180. As would be expected, the P-type well region 180 is doped with a predetermined amount of a P-type dopant, such as boron. Also located within the substrate 110 in the NMOS device region 160 are conventional-type source/drain regions 190. The N-type source/drain regions 190, opposite to the P-type well region 180, are doped with an N-type dopant such as phosphorous, arsenic or another similar dopant.

Special to the present invention, the thickness of the gate dielectric layer 133 of the PMOS device region 120 typically differs from the thickness of the gate dielectric layer 173 of the NMOS device region 160. In an exemplary embodiment, the thickness of the gate dielectric layer 133 is slightly greater than the thickness of the gate dielectric layer 173. For instance, it can be envisioned where the thickness of the gate dielectric layer 133 ranges from about 10% to about 30% greater than the thickness of the gate dielectric layer 173. Therefore, without being bound to these illustrative ranges, the thickness of the gate dielectric layer 133 would range from about 0.8 nm to about 10 nm and the thickness of the gate dielectric layer 173 would range from about 0.5 nm to about 7.5 nm in an exemplary embodiment of the present invention.

Figure 2:
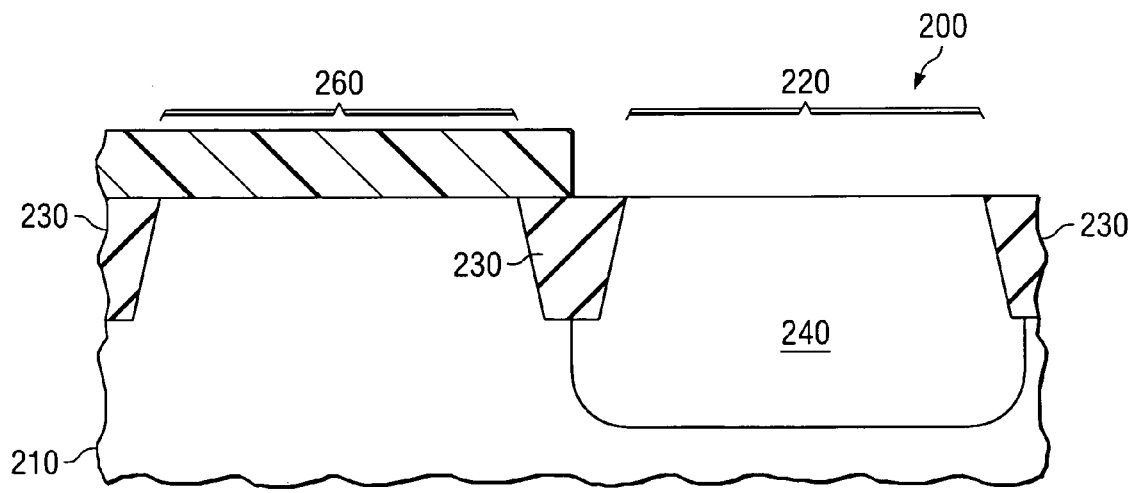
FIG. 2 illustrates a cross-sectional view of a partially completed CMOS device manufactured in accordance with the principles of the present invention.

Turning now to FIGS. 2–9, illustrated are cross-sectional views of detailed manufacturing steps instructing how one might, in an advantageous embodiment, manufacture a CMOS device similar to the CMOS device 100 depicted in FIG. 1. FIG. 2 illustrates a cross-sectional view of a partially completed CMOS device 200 manufactured in accordance with the principles of the present invention. The partially completed CMOS device 200 includes a substrate 210. The substrate 210 may, in an exemplary embodiment, be any layer located in the partially completed CMOS device 200, including a wafer itself or a layer located above the wafer (e.g., epitaxial layer). In the embodiment illustrated in FIG. 2, the substrate 210 is a P-type semiconductor substrate; however, one skilled in the art understands that the substrate 210 could be an N-type substrate without departing from the scope of the present invention.

The embodiment of the partially completed CMOS device 200 illustrated in FIG. 2, includes two device regions. The two device regions consist of a PMOS device region 220 and an NMOS device region 260. One skilled in the art understands the differences between the PMOS device region 220 and the NMOS device region 260. For example, those skilled in the art understand that the dopant type substantially affects whether a device is a PMOS device or an NMOS device. Those skilled in the art also understand that other device regions, similar or dissimilar thereto, may be located to the left or right of the PMOS device region 220 or NMOS device region 260.

Located within the substrate 210 in the embodiment shown in FIG. 2 are isolation regions 230. The isolation regions 230, which happen to be shallow trench isolation regions, are conventional structures formed using conventional techniques and are used to isolate the PMOS device region 220 and NMOS device region 260 from one another. As those skilled in the art understand the various steps used to form these conventional isolation regions 230, no further detail will be given.

In the illustrative embodiment of FIG. 2, formed within the substrate 210, and within the PMOS device region 220, is an N-type well region 240. The n-type well region 240, in light of the P-type semiconductor substrate being used, would more than likely contain an N-type dopant. For example, the N-type well region 240 would likely be doped with a dose ranging from about 1E13 atoms/cm$^2$ to about 1E14 atoms/cm$^2$ and at a power ranging from about 100 keV to about 500 keV. What generally results is the N-type well region 240 having an N-type peak dopant concentration ranging from about 5E17 atoms/cm$^3$ to about 1E19 atoms/cm$^3$. As those skilled in the art are well aware of the steps generally used to form the N-type well regions 240, no further details will be given.

In an optional step not shown, a PMOS threshold voltage ($V_t$) implant may be applied to the substrate 210 within the PMOS device region 220. The PMOS threshold voltage ($V_t$) implant, if used, is generally intended to set the long channel (or gate length) transistor threshold voltage and I/O transistor threshold voltage in the PMOS device region 220. Often, a power of about 30 keV to about 60 keV and a dose ranging from about 2E12 atoms/cm$^2$ to about 8E12 atoms/cm$^2$ may be used to form the PMOS threshold voltage ($V_t$) implant.

Similarly, a punch through implant, a channel stop implant and a buried layer implant may optionally be used in the PMOS device region 220. Their purposes include, preventing-well to-well punch through, for preventing short channel effects, and for preventing transistor latchup, respectively. Nonetheless, these and other steps have been omitted for clarity.

Figure 3:
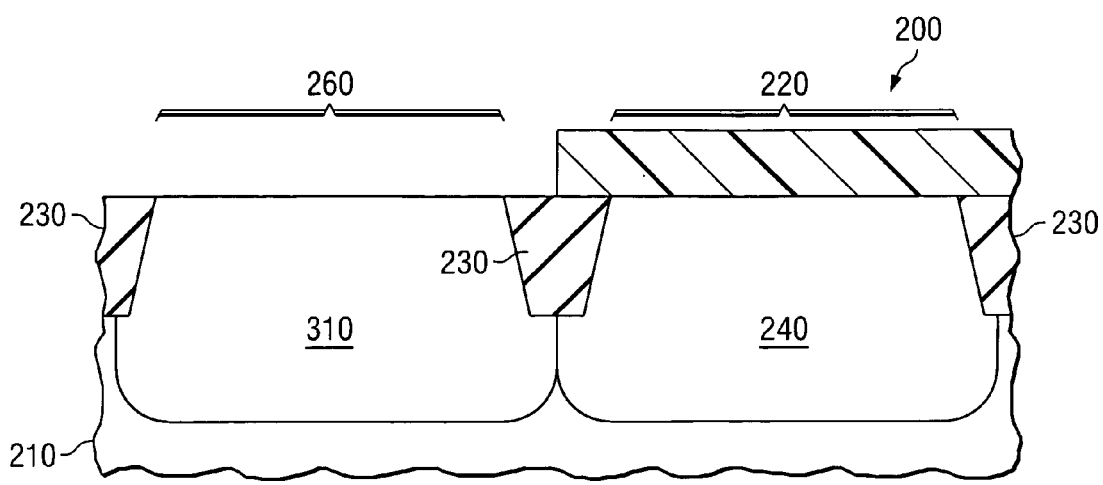
FIG. 3 illustrates a cross-sectional view of the partially completed CMOS device illustrated in FIG. 2 after forming a P-type well region in the substrate within the NMOS device region.

Turning now to FIG. 3, illustrated is a cross-sectional view of the partially completed CMOS device 200 illustrated in FIG. 2 after forming a P-type well region 310 in the substrate 210 within the NMOS device region 260. The P-type well region 310 is generally doped with a P-type dopant. For example, the P-type well region 310 would likely be doped with a dose ranging from about 1E13 atoms/cm$^2$ to about 1E14 atoms/cm$^2$ and at a power ranging from about 70 keV to about 300 keV. What generally results is the P-type well region 310 having a P-type peak dopant concentration ranging from about 5E17 atoms/cm$^3$ to about 1E19 atoms/cm$^3$. Similar to above, no further details are warranted.

In an optional step not shown, an NMOS threshold voltage ($V_t$) implant may be applied to the substrate 210 within the NMOS device region 260. The NMOS threshold voltage ($V_t$) implant, if used, is generally intended to set the long channel (or gate length) transistor threshold voltage and I/O transistor threshold voltage in the NMOS device region 260. Often, a power of about 8 keV to about 20 keV and a dose ranging from about 2E12 atoms/cm$^2$ to about 8E12 atoms/cm$^2$ may be used to form the NMOS threshold voltage ($V_t$) implant. Similar to above, a punch through implant, a channel stop implant and a buried layer implant may optionally be used in the NMOS device region 260.

Figure 4:
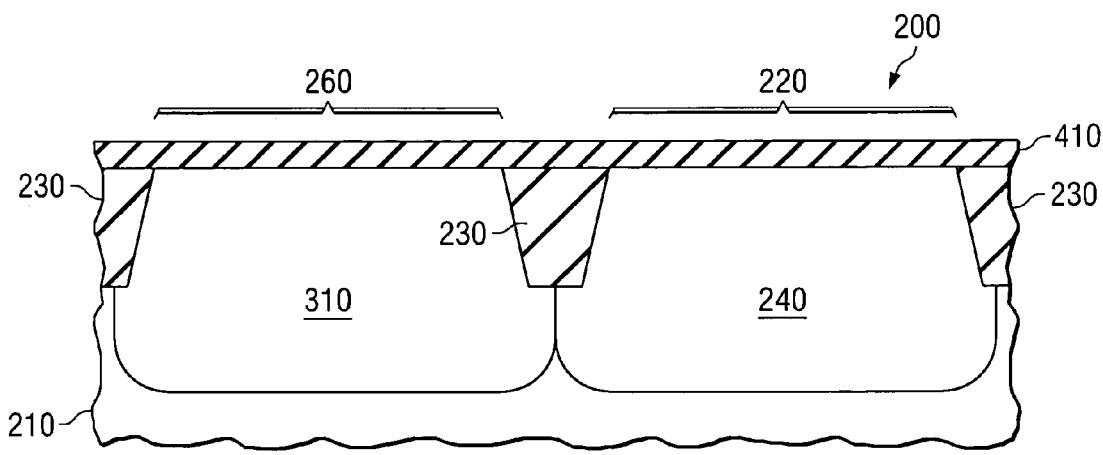
FIG. 4 illustrates a cross-sectional view of the partially completed CMOS device illustrated in FIG. 3 after forming a blanket layer of gate dielectric material over the substrate.

Turning now to FIG. 4, illustrated is a cross-sectional view of the partially completed CMOS device 200 illustrated in FIG. 3 after forming a blanket layer of gate dielectric material 410 over the substrate 210. The layer of gate dielectric material 410 may comprise a number of different materials and stay within the scope of the present invention. For example, the layer of gate dielectric material 410 may comprise silicon dioxide, or in an alternative embodiment comprise a high dielectric constant (K) material. In the illustrative embodiment of FIG. 4, however, the layer of gate dielectric material 410 is a silicon dioxide layer having a thickness ranging from about 0.5 nm to about 10 nm.

The layer of gate dielectric material 410, which happens to be a silicon dioxide gate dielectric layer in the disclosed embodiment, is thermally grown in the exemplary embodiment of FIG. 4. The thermal growth allows for a high quality appropriate thickness layer of gate dielectric material 410 to be formed. While thermal growth is disclosed, those skilled in the art understand that a deposition process might also be used.

Figure 5:
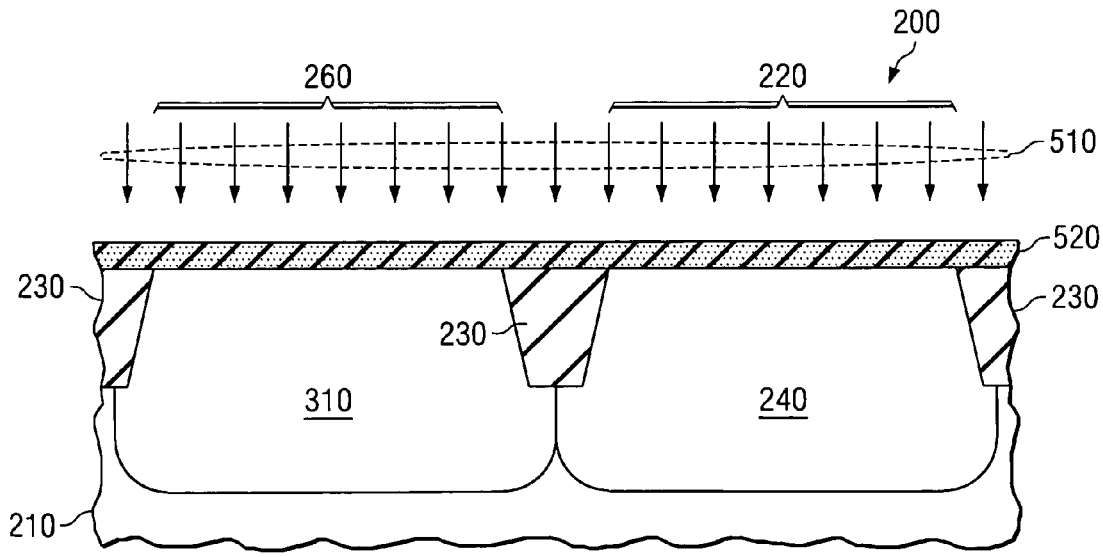
FIG. 5 illustrates a cross-sectional view of the partially completed CMOS device illustrated in FIG. 4 after subjecting the layer of dielectric material to a nitridation process, thereby forming a layer of dielectric material having nitrogen therein.

Turning now to FIG. 5, illustrated is a cross-sectional view of the partially completed CMOS device 200 illustrated in FIG. 4 after subjecting the layer of dielectric material 410 to a nitridation process 510, thereby forming a layer of dielectric material having nitrogen therein 520. Those skilled in the art understand that the specific nitridation process, as well as the parameters of the given nitridation process, may vary. One exemplary embodiment of the invention, however, uses a nitrogen containing plasma process as the nitridation process of FIG. 5. The nitrogen containing plasma process, if used, might use a pressure less than about 50 mTorr. Similarly, the nitrogen containing plasma process may use a RF power ranging from about 300 equivalent DC watts to about 1000 equivalent DC watts and a temperature ranging from about room temperature to about 600° C. While specific ranges have been given for pressure, power and temperature, other pressures, powers and temperatures outside of the disclosed ranges may obviously be used.

It should be noted that the nitrogen containing plasma process is but one of the many nitridation processes that could be used to introduce nitrogen into the layer of gate dielectric material 410. One of the many other nitridation processes includes a furnace/rapid thermal anneal nitridation process. While the furnace/rapid thermal anneal nitridation process would most likely suffice, it is believed that the nitrogen containing plasma process works better, especially for the layer of gate dielectric material that will ultimately form a portion of the gate dielectric layer for the PMOS device region 220.

The nitrogen, as those skilled in the art appreciate, may be supplied by a number of different sources. For instance, in one exemplary embodiment of the invention the nitrogen is supplied using nitrogen gas ($N_2$). In other embodiments of the invention, however, the nitrogen may be supplied using a source selected from the group consisting of $NH_3$, NO, $N_2O$, or mixtures thereof. Other nitrogen sources may nonetheless also be used.

The resulting layer of gate dielectric material having nitrogen 520 desirably has a relatively large amount of nitrogen located therein. For example, in an exemplary embodiment the layer of gate dielectric material having nitrogen 520 contains an amount of nitrogen ranging from about 5E15 atoms/cm$^3$ to about 5E16 atoms/cm$^3$, and more specifically an amount of nitrogen ranging from about 6E15 atoms/cm$^3$ to about 1E16 atoms/cm$^3$.

After completing the nitridation process 510, the layer of gate dielectric material containing nitrogen 520 may be subjected to an anneal. This anneal, which may include temperatures ranging from about 900° C. to about 1200° C. for a time period ranging from about 5 seconds to about 60 seconds, is designed to stabilize the nitrided oxide and minimize nitrogen out-diffusion. Other temperatures and times could nonetheless be used for the anneal.

Figure 6:
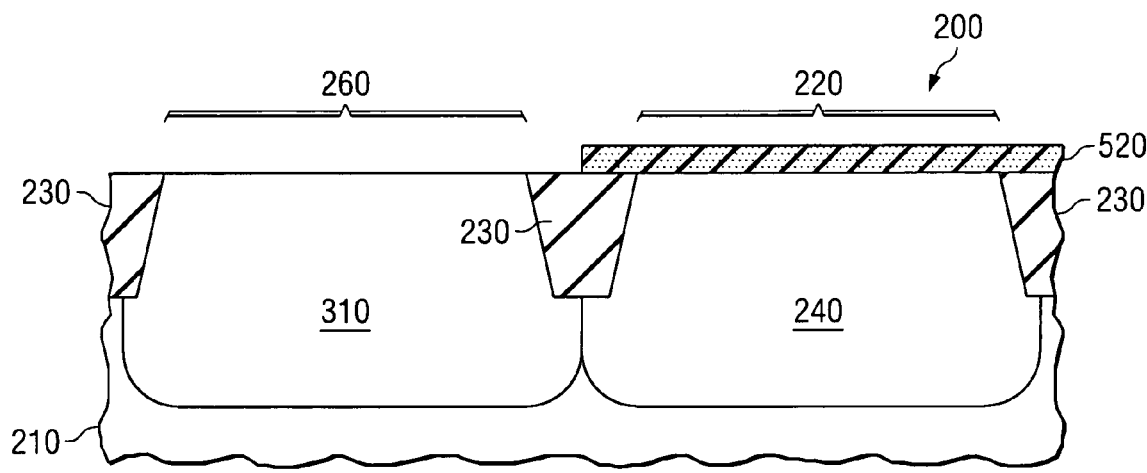
FIG. 6 illustrates a cross-sectional view of the partially completed CMOS device illustrated in FIG. 5 after removing at least a portion of the layer of gate dielectric material containing nitrogen from the substrate.

Turning now to FIG. 6, illustrated is a cross-sectional view of the partially completed CMOS device 200 illustrated in FIG. 5 after removing at least a portion of the layer of gate dielectric material containing nitrogen 520 from the substrate 210. Those skilled in the art understand the many processes that might be used to remove the portion of the layer of gate dielectric material containing nitrogen 520 from the substrate 210. In the given embodiment, an exemplary lithographic process was used to remove the portion of the layer of gate dielectric material containing nitrogen 520 from the substrate 210.

Lithography refers to a process for pattern transfer between various media. The lithographic process may include forming a radiation sensitive resist coating over the layer to be patterned, in this case the layer of gate dielectric material containing nitrogen 520. The radiation sensitive resist coating may then be patterned by selectively exposing the resist through a mask. In turn, the exposed areas of the coating become either more or less soluble than the unexposed areas, depending on the type of resist. A solvent developer may then be used to remove the less soluble areas leaving the patterned resist layer. After the resist layer is patterned, the exposed portion of the layer of gate dielectric material containing nitrogen 520 may be etched using the patterned resist layer as a mask to transfer the pattern to the exposed portion of the layer of gate dielectric material containing nitrogen 520. Etch processes, among others, might include plasma etching, reactive ion etching, wet etching, or combinations thereof. In the embodiment of FIG. 6, the portion of the layer of gate dielectric material containing nitrogen 520 that remains after the lithograph process is located in the PMOS device region 220.

Figure 7:
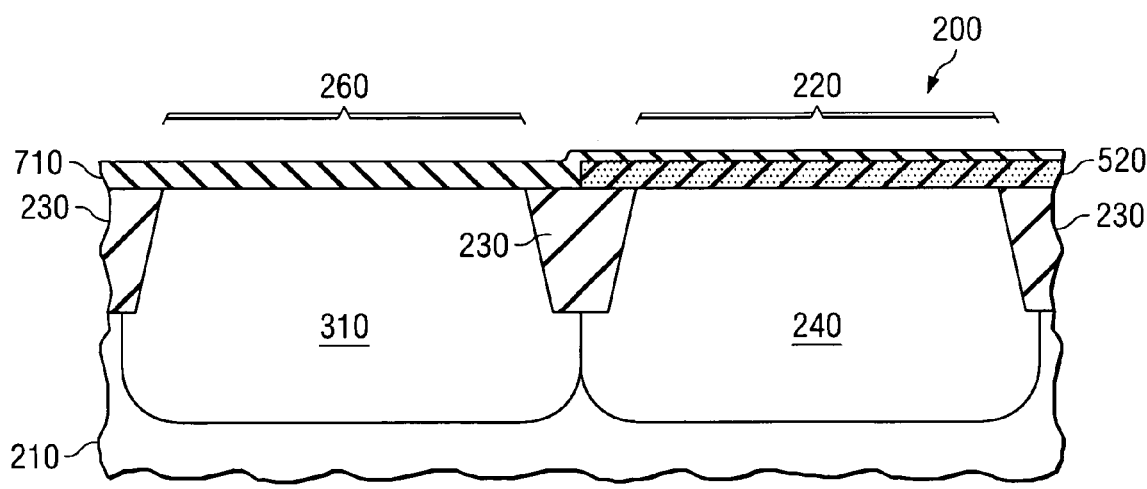
FIG. 7 illustrates a cross-sectional view of the partially completed CMOS device illustrated in FIG. 6 after formation of a second layer of gate dielectric material over the substrate where the portion of the layer of gate dielectric material containing nitrogen was removed.

Turning now to FIG. 7, illustrated is a cross-sectional view of the partially completed CMOS device 200 illustrated in FIG. 6 after formation of a second layer of gate dielectric material 710 over the substrate 210 where the portion of the layer of gate dielectric material containing nitrogen 520 was removed. The second layer of gate dielectric material 710 may also comprise a number of different materials and stay within the scope of the present invention. For example, the second layer of gate dielectric material 710 may comprise silicon dioxide, or in an alternative embodiment comprise a high dielectric constant (K) material. In the illustrative embodiment of FIG. 7, however, the second layer of gate dielectric material 710 comprises the same material as the layer of gate dielectric material 410, and therefore comprises silicon dioxide. In this embodiment, the second layer of gate dielectric material 710 would have a thickness ranging from about 0.5 nm to about 10 nm.

The second layer of gate dielectric material 710 in the exemplary embodiment of FIG. 7 is a thermally grown silicon dioxide layer. The thermal growth allows for a high quality appropriate thickness second layer of gate dielectric material 710 to be formed. Again, while thermal growth is disclosed, those skilled in the art understand that a deposition process might also be used.

The formation of the second layer of gate dielectric material 720 will most likely cause some increase in thickness to the patterned layer of gate dielectric material containing nitrogen 520. This increased thickness will be small, as the rate of oxidation of the layer of gate dielectric material containing nitrogen 520 will be substantially reduced as a result of it having large amounts of nitrogen therein. Nevertheless, if this increased thickness is a problem, the final thickness of the patterned layer of gate dielectric material containing nitrogen 520 may be tailored by altering the initial thickness of the layer of gate dielectric material 410 or altering the amount of nitrogen contained therein.

Figure 8:
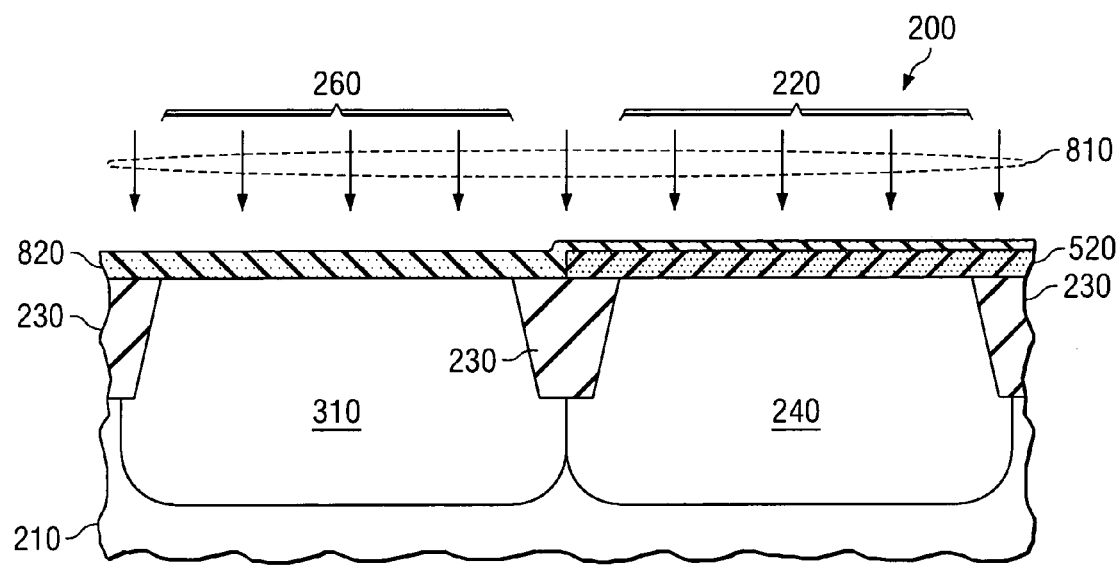
FIG. 8 illustrates a cross-sectional view of the partially completed CMOS device illustrated in FIG. 7 after subjecting the second layer of dielectric material to a second nitridation process, thereby forming a second layer of dielectric material having nitrogen therein.

Turning now to FIG. 8, illustrated is a cross-sectional view of the partially completed CMOS device 200 illustrated in FIG. 7 after subjecting the second layer of dielectric material 710 to a second nitridation process 810, thereby forming a second layer of dielectric material having nitrogen therein 820. Similar to the first nitridation process, the specific nitridation process used for the second nitridation process, as well as the parameters of the given second nitridation process, may vary.

One exemplary embodiment of the invention, however, uses a nitrogen containing plasma process as the second nitridation process of FIG. 8. The nitrogen containing plasma process, if used, might use a pressure less than about 50 mTorr. Similarly, the second nitrogen containing plasma process may use an RF power ranging from about 300 equivalent DC watts to about 1000 equivalent DC watts and a temperature ranging from about room temperature to about 600° C. While specific ranges have been given for pressure, power and temperature, other pressures, powers and temperatures outside of the disclosed ranges may obviously be used for the second nitrogen containing plasma process.

It should be noted that the nitrogen containing plasma process is but one of the many nitridation processes that could be used to introduce nitrogen into the second layer of gate dielectric material 710. One of the many other nitridation processes includes a furnace/rapid thermal anneal nitridation process. Contrary to the first nitridation process, it is believed that the furnace/rapid thermal anneal nitridation process would work equally as well as the nitrogen containing plasma process.

The nitrogen, as those skilled in the art appreciate, may be supplied by a number of different sources. For instance, in one exemplary embodiment of the invention the nitrogen is supplied using nitrogen gas ($N_2$). In other embodiment of the invention, however, the nitrogen may be supplied using a source selected from the group consisting of $NH_3$, NO, $N_2O$, or mixtures thereof. Other nitrogen sources may nonetheless also be used.

The resulting second layer of gate dielectric material having nitrogen 820 desirably has a different amount of nitrogen located therein than the layer of gate dielectric material having nitrogen 520. For example, in an exemplary embodiment the second layer of gate dielectric material having nitrogen 820 contains an amount of nitrogen ranging from about 1E14 atoms/cm$^3$ to about 5E16 atoms/cm$^3$, and more specifically an amount of nitrogen ranging from about 1E15 atoms/cm$^3$ to about 5E15 atoms/cm$^3$.

After completing the nitridation process 810, the second layer of gate dielectric material containing nitrogen 820 may also be subjected to an anneal. This anneal, which may include temperatures ranging from about 900° C. to about 1200° C. for a time period ranging from about 5 seconds to about 60 seconds, is again designed to stabilize the nitrided oxide and minimize nitrogen out-diffusion. Other temperatures and times could nonetheless be used for this anneal.

Figure 9:
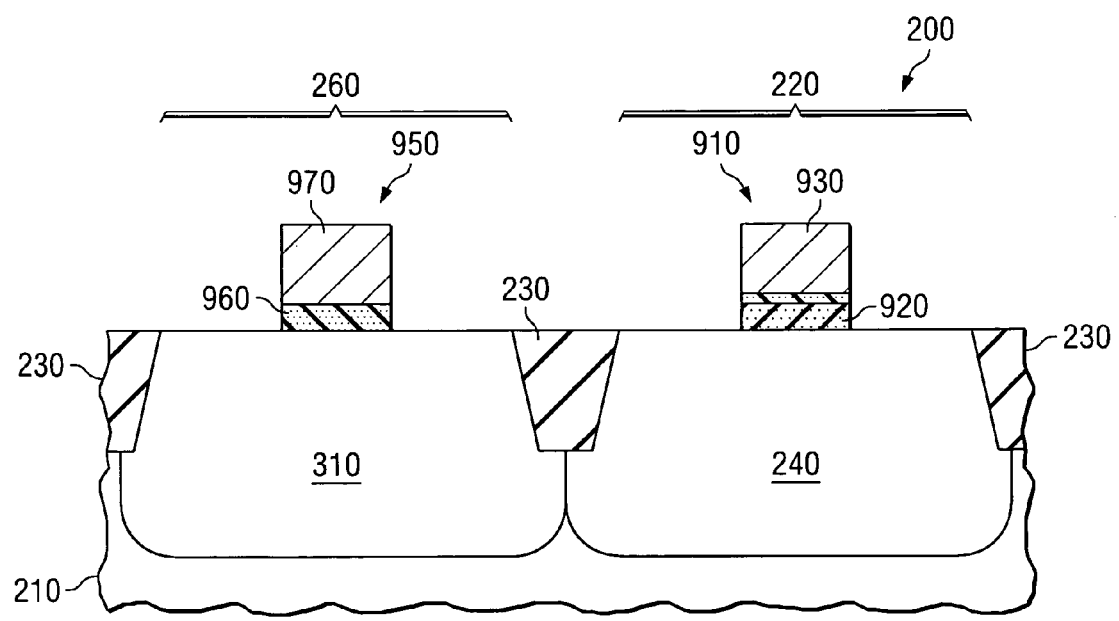
FIG. 9 illustrates a cross-sectional view of the partially completed CMOS device illustrated in FIG. 8 after formation of a gate electrode layer over the first and second layers of gate dielectric material having nitrogen and patterning the gate electrode layer and first and second layers of gate dielectric material having nitrogen to form first and second gate structures.

Turning now to FIG. 9, illustrated is a cross-sectional view of the partially completed CMOS device 200 illustrated in FIG. 8 after formation of a gate electrode layer over the first and second layers of gate dielectric material having nitrogen 520, 820, and patterning the gate electrode layer and first and second layers of gate dielectric material having nitrogen 520, 820, to form first and second gate structures 910, 950. The first gate structure 910, which in the embodiment of FIG. 9 is formed in the PMOS device region 220, includes a first gate dielectric layer 920 and a first gate electrode layer 930. As would be expected, the first gate dielectric layer 920 includes a given nitrogen concentration.

Conversely, the second gate structure 950, which in the embodiment of FIG. 9 is formed in the NMOS device region 260, includes a second gate dielectric layer 960 and a second gate electrode layer 970. As is desired by the present invention, the second gate dielectric layer 960 would have a different nitrogen concentration than the first gate dielectric layer 920. More specifically, following the manufacturing scheme set forth in FIGS. 2–9, the second gate dielectric layer 960 would have a nitrogen concentration less than a concentration of the first gate dielectric layer 920. Accordingly, the first and second gate dielectric layers 920, 960, may individually be tailored for their specific device, which happens to be a PMOS device region 220 and NMOS device region 260, respectively.

Those skilled in the art understand that conventional lithography may be used to pattern the first and second gate structures 910, 950. More specifically, those skilled in the art understand that a lithography process similar to that disclosed above with respect to FIG. 6 may be used to define the first and second gate structures 910, 950.

After patterning the first and second gate structures 910, 950, the manufacturing process would continue in a conventional manner, resulting in a device similar to the CMOS device 100 illustrated in FIG. 1. Without being limited to such, the additional manufacturing steps might include the formation of sidewall spacers, source/drain regions, halo implants, etc.

The present invention, as opposed to the prior art, allows the amount of nitrogen in the gate dielectric layer of PMOS devices to be different than the amount of nitrogen in the gate dielectric of NMOS devices. Accordingly, the differing amounts of nitrogen allows the dielectric constant, and thus threshold voltage ($V_t$) of the different gate dielectric layers to be optimized (e.g., individually tuned) for each. Therefore, the method for manufacturing a CMOS device according to the principles of the present invention helps to obtain the best performance from both PMOS devices and NMOS devices by independently optimizing the nitrogen concentration in the gate dielectric layers for each, especially for dual metal gate CMOS structures.

Figure 10:
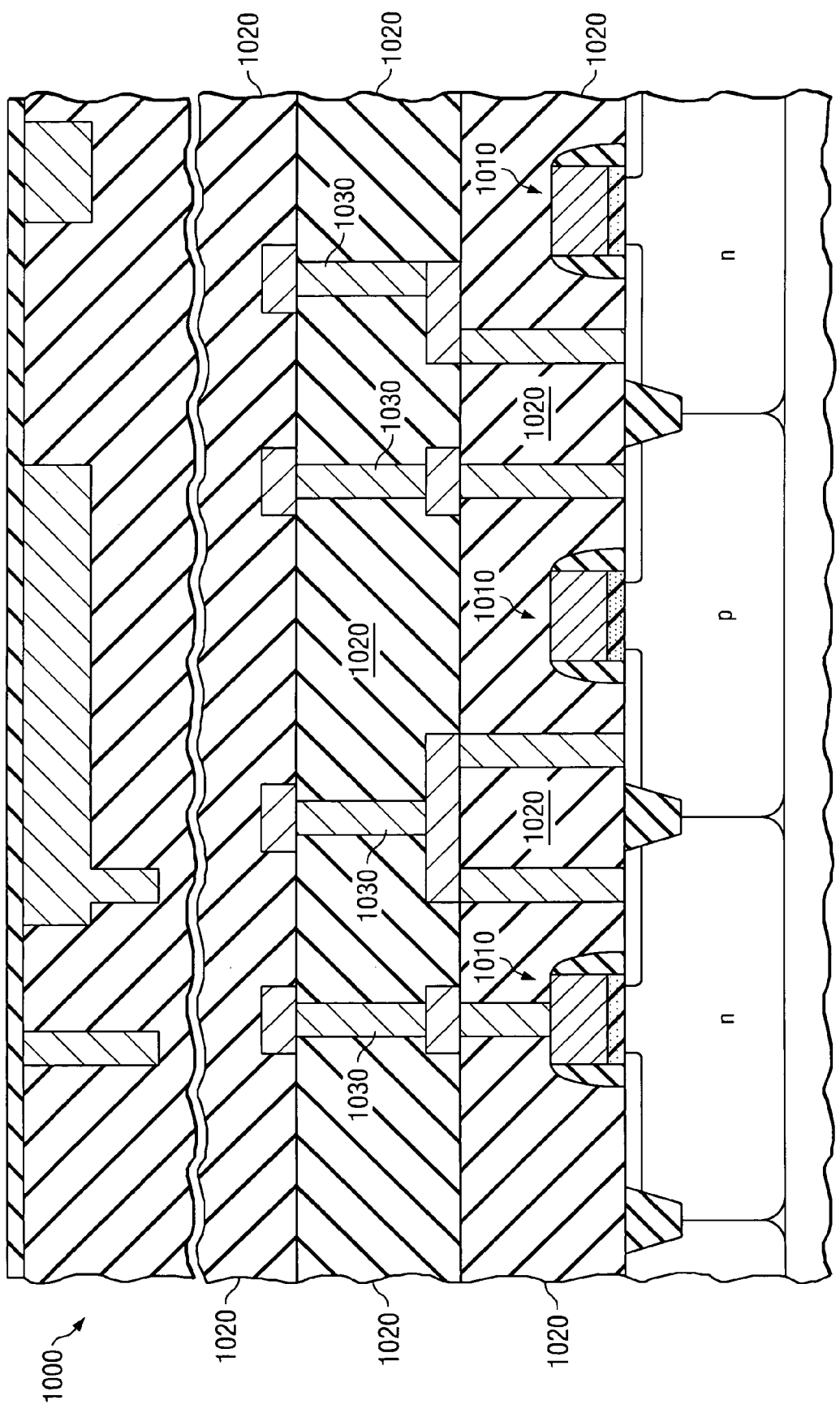
FIG. 10 illustrates a sectional view of a conventional integrated circuit (IC) incorporating a CMOS device constructed according to the principles of the present invention.

Referring finally to FIG. 10, illustrated is a sectional view of a conventional integrated circuit (IC) 1000 incorporating a CMOS device 1010 constructed according to the principles of the present invention. The IC 1000 may include devices, such as transistors used to form CMOS devices, BiCMOS devices, Bipolar devices, or other types of devices. The IC 1000 may further include passive devices, such as inductors or resistors, or it may also include optical devices or optoelectronic devices. Those skilled in the art are familiar with these various types of devices and their manufacture. In the particular embodiment illustrated in FIG. 10, the IC 1000 includes the CMOS device 1010 having dielectric layers 1020 located thereover. Additionally, interconnect structures 1030 are located within the dielectric layers 1020 to interconnect various devices, thus, forming the operational integrated circuit 1000.

Although the present invention has been described in detail, those skilled in the art should understand that they can make various changes, substitutions and alterations herein without departing from the spirit and scope of the invention in its broadest form.

What is claimed is:

1. A complementary metal oxide semiconductor (CMOS) device, comprising:
   a p-channel metal oxide semiconductor (PMOS) device having a first gate dielectric layer and a first gate electrode layer located over a substrate, wherein the first gate dielectric layer has an amount of nitrogen located therein; and
   an n-channel metal oxide semiconductor (NMOS) device having a second gate dielectric layer and a second gate electrode layer located over the substrate, wherein the second gate dielectric layer has a different amount of nitrogen located therein, and wherein the first gate dielectric layer has a greater amount of nitrogen therein than the second gate dielectric layer.

2. The CMOS device as recited in claim 1 wherein a thickness of the first gate dielectric layer differs from a thickness of the second gate dielectric layer.

3. The CMOS device as recited in claim 2 wherein the thickness of the first gate dielectric layer ranges from about 0.8 nm to about 10 nm and the thickness of the second gate dielectric layer ranges from about 0.5 nm to about 7.5 nm.

4. The CMOS device as recited in claim 2 wherein the thickness of the first gate dielectric layer ranges from about 10% to about 30% thicker than the thickness of the second gate dielectric layer.

5. The CMOS device as recited in claim 1 wherein the amount of nitrogen located within the first gate dielectric layer ranges from about 5E15 atoms/cm$^3$ to about 5E16 atoms/cm$^3$ and the amount of nitrogen located within the second gate dielectric layer ranges from about 1E14 atoms/cm$^3$ to about 5E16 atoms/cm$^3$.

6. The CMOS device as recited in claim 1 wherein the PMOS device and the NMOS device form a portion of a same power device.

7. The CMOS device as recited in claim 1 wherein the PMOS device and the NMOS device are both low power devices.

* * * * *